（12）United States Patent
Ahuja et al.

(10) Patent No.: US 7,249,217 B2
(45) Date of Patent: Jul. 24, 2007

(54) CONTENT ADDRESSABLE MEMORY (CAM) AND METHOD OF DOWNLOADING AND BANKING FILTERS

(75) Inventors: Ritesh Ahuja, Gaithersburg, MD (US); Tobias Karlsson, Rockville, MD (US)

(73) Assignee: Telefonaktiebolaget LM Ericsson, Stockholm (SE)

( * ) Notice: Subject to any disclaimer, the term of this patent is extended or adjusted under 35 U.S.C. 154(b) by 346 days.

(21) Appl. No.: 11/073,434

(22) Filed: Mar. 7, 2005

(65) Prior Publication Data

US 2006/0200622 A1    Sep. 7, 2006

(51) Int. Cl.
    *G06F 12/06* (2006.01)
(52) U.S. Cl. ................................................ 711/108
(58) Field of Classification Search ............... 711/108, 711/202
    See application file for complete search history.

(56) References Cited

U.S. PATENT DOCUMENTS

| | | | |
|---|---|---|---|
| 6,549,442 B1* | 4/2003 | Lu et al. .................... | 365/49 |
| 7,019,674 B2* | 3/2006 | Cadambi et al. ............ | 341/106 |
| 7,031,313 B2* | 4/2006 | Yazaki et al. ............... | 370/392 |
| 7,185,172 B1* | 2/2007 | Mick et al. .................. | 711/206 |

* cited by examiner

*Primary Examiner*—Kevin L. Ellis

(57) ABSTRACT

A Content Addressable Memory (CAM) that downloads and banks a group of filters. Each filter has an associated filter-index, which is mapped in a mapping table to an available CAM address for storing the associated filter. Each succeeding filter in the group of filters is stored in a higher address in the CAM. The plurality of CAM addresses may not all be contiguous, in which case the mapping table maps each succeeding filter-index to the next higher available CAM address without regard to contiguity of the addresses.

14 Claims, 2 Drawing Sheets

CONTENT ADDRESSABLE MEMORY (CAM) AND METHOD OF DOWNLOADING AND BANKING FILTERS

BACKGROUND

The present invention relates to packet-based communication systems. More particularly, and not by way of limitation, the present invention is directed to a Content Addressable Memory (CAM) and method of downloading and banking filters in the CAM.

CAMs are very commonly used in network devices to perform multi-field classification/searching on packet header fields. A CAM stores a number of filters, and the first filter that matches the fields in the packet header is returned as a match. Generally, there are different types/groups of filters that are stored in the CAM based on the application for which each filter type is used. For example, one filter group may be used for tunnels, another group may be used for differentiated services (diffserv), another group for firewall, and the like. A search is usually done for multiple filter groups depending upon the type of packet and the results of previous filter lookups on the packet.

To reduce the number of lookups needed in the CAM for each packet, filters within a filter-group are usually "flattened", where user-defined filters (which could require multiple lookups in the CAM for each packet) are optimally combined to form the CAM filters that are actually installed in the CAM for packet searches. This process of flattening results in an increase in the number of filters to be installed in the CAM, but ensures that each packet will require only one lookup for a particular filter group (i.e., only one CAM lookup for each application), instead of multiple CAM lookups, as would be required per group if the filters were not flattened.

Whenever there is a change in user-defined policy that requires a change in filters for a particular application/filter-group, the filters for that particular group have to be flattened again. This may generate a completely new set of filters for that filter-group. Therefore, this new set of filters is downloaded to the CAM in a separate bank for the new filter-group, while the old filters are still being used for lookup. After the download process is completed, the banks for the given filter-group are switched so that the newly downloaded filters become active and the old bank, that has now become inactive, is free for use for the next download operation for the filter-group. Thus, essentially two banks are maintained for each filter-group: one bank that is active and is being used for doing lookups, and one bank that is reserved for downloading new filters. Additionally, since the number of filters in different filter-groups can vary widely (depending upon the characteristics requirements of the product for different applications), the inactive banks for different filter-groups cannot be shared even though only one bank is being downloaded at a time. Once the inactive bank is made active, the new spare bank that was earlier being used for one filter-group may not be big enough for the next filter-group that needs an update.

Thus, a major problem with the existing filter-bank implementation is that it requires double the needed CAM space for bank management. This wastes valuable CAM memory that is usually expensive and power-hungry. Also, it is not possible to use the CAM in a completely shared mode where filters not being used by one application can be utilized by another application.

A known approach that solves some of the problems of the existing filter-bank implementation is to make all filter-groups the same size. This allows the spare bank to be shared among all filter-groups, thus removing the need for a separate spare bank for each and every filter-group. However, this approach is still inefficient because it allocates the same amount of CAM space to an application requiring only a small number of filters as it allocates to an application requiring a large number of filters. For example, if a product needs to support up to 256 tunnels and up to 4K diffserv filters for Quality of Service (QoS) provisioning, the filter-group used for tunneling would be allocated as much CAM space as the filter-group used for diffserv, thereby wasting 16 times more CAM space than needed for tunnels. Thus, this approach works well only if the different applications require approximately the same amount of CAM space, thus reducing the amount of wasted CAM memory. However, this approach still does not allow the entire CAM to be used in a completely dynamically shared mode in which any application can use the filters not being used by another application. For example, this approach does not enable a user to install more than 256 tunnels in a CAM that has far less than 4 k diffserv filters configured.

SUMMARY

The present invention eliminates the use of dedicated banks of contiguous CAM addresses for different filter-groups. Instead, a top-level layer of virtual bank management emulates the behavior of different banks by mapping different filter indexes in different filter-groups to individual filter CAM addresses. When using this approach, the filters in a particular filter-group do not need to be contiguous in the CAM. The only requirement is that the filters are in the correct order relative to other filters in the same group so that they can be properly mapped into the filter-group. Each filter-group has a mapping table that maps an original user-provided filter-index to a CAM address for every filter in the group.

Thus, in one aspect, the present invention is directed to a Content Addressable Memory (CAM) that includes means for downloading a group of filters, each of which has an associated filter-index; a plurality of CAM addresses for storing the group of downloaded filters; and a mapping table for mapping each filter-index to an associated CAM address available for storing the downloaded filter associated with the filter-index. Wherein each succeeding filter in the group of filters is stored in a higher address in the CAM. The plurality of CAM addresses may not all be contiguous, in which case the mapping table maps each succeeding filter-index to the next higher available CAM address without regard to contiguity of the addresses.

In another aspect, the present invention is directed to a method of downloading and banking in the CAM, a filter-group having a plurality of filters. The method includes the steps of establishing a mapping table for the filter-group; downloading a plurality of filter-indexes associated with the filters in the filter-group; and mapping each filter-index to an associated CAM address available for storing the downloaded filter associated with the filter-index. Wherein each succeeding filter in the group of filters is stored in a higher address in the CAM. The plurality of CAM addresses may not all be contiguous, and the step of mapping may include mapping each succeeding filter-index to the next higher available CAM address without regard to contiguity of the addresses.

In yet another aspect, the present invention is directed to a method of downloading and banking in the CAM, a filter-group having a plurality of filters. The method includes the steps of a) downloading a plurality of filter-indexes associated with the filters in the filter-group; b) establishing a mapping table for mapping each filter-index to an associated CAM address available for storing the downloaded filter associated with the filter-index; c) determining the lowest available filter CAM address; d) associating the first filter-index with the lowest available filter CAM address; e) determining the next higher available filter CAM address; f) associating the next filter-index with the next higher available filter CAM address; g) determining whether the last filter-index in the downloaded group has been associated with an address; h) upon determining that the last filter-index in the downloaded group has not been associated with an address, repeating steps e) through g); and i) upon determining that the last filter-index in the downloaded group has been associated with an address, ending the method. Step e) may include determining a CAM address that is not contiguous to a previously associated CAM address.

BRIEF DESCRIPTION OF THE SEVERAL VIEWS OF THE DRAWINGS

In the following section, the invention will be described with reference to exemplary embodiments illustrated in the figures, in which.

DETAILED DESCRIPTION

The present invention eliminates the use of dedicated banks of contiguous CAM addresses for different filter-groups. Instead, a top-level layer of virtual bank management emulates the behavior of different banks by mapping different filter indexes in different filter-groups to individual filter CAM addresses. When using this approach, the filters in a particular filter-group do not need to be contiguous in the CAM. The only requirement is that the filters are in the correct order relative to other filters in the same group so that they can be properly mapped into the filter-group. Each filter-group has a mapping table that maps an original user-provided filter-index to a CAM address for every filter in the group.

Figure 1:
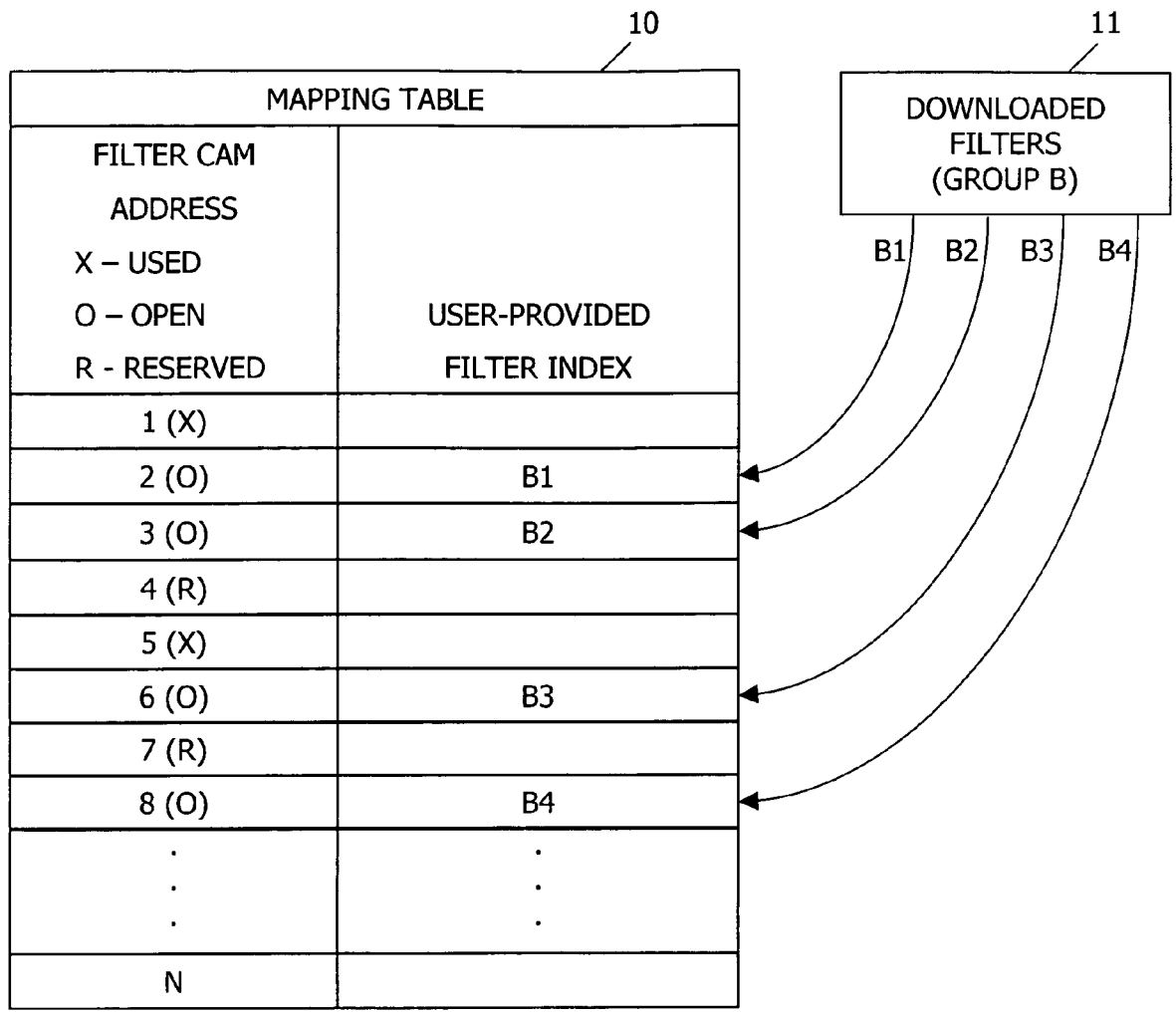
FIG. 1 is a mapping table utilized in the present invention to emulate filter-banks in a CAM.

FIG. 1 is a mapping table 10 utilized in the present invention to emulate filter-banks in a CAM. For simplicity, FIG. 1 shows filter-indexes B1-B4 and filter CAM addresses 1-8. As the user downloads filters for a given filter-group such as Group B 11, free CAM entries are allocated from the lowest available (open) filter CAM address without any regard for contiguity. The mapping table then stores the mapping from the filter-index provided by the user to the actual CAM address. As long as each succeeding filter is allocated a higher address in the CAM, the filters will be searched in the correct order. Additionally, the filter-group is stored as part of the CAM search key so that only relevant filters are searched when a lookup is performed for a particular application. Also, if needed, the matching CAM address may be mapped back to the original filter-index by using another mapping table.

As long as there are enough free CAM entries available for the new group being downloaded, the invention will work, irrespective of where or how scattered these CAM entries are. In one embodiment, the invention ensures there are enough free CAM entries available by reserving enough CAM entries to download the largest filter group utilized in the CAM. Thus, unused CAM space is limited to the space needed by the largest filter-group, instead of requiring double the CAM space, as in prior art solutions. For example, a product may require ten different filter-groups, each requiring anywhere from 256 to 4 k CAM entries, for a total of 16 k CAM entries. The unused CAM space with the present invention is only 4 k CAM entries, compared to either 16 k unused CAM entries if two banks are used for each filter-group, or 28 k (11*4 k−16 k) unused CAM entries if all of the ten filter-groups are forced to be the same size. Moreover, the present invention allows the entire CAM to be used in a completely dynamically shared mode in which unused filter addresses from one application can be readily used by any other application. This feature is not provided by either of the two existing approaches.

Figure 2:
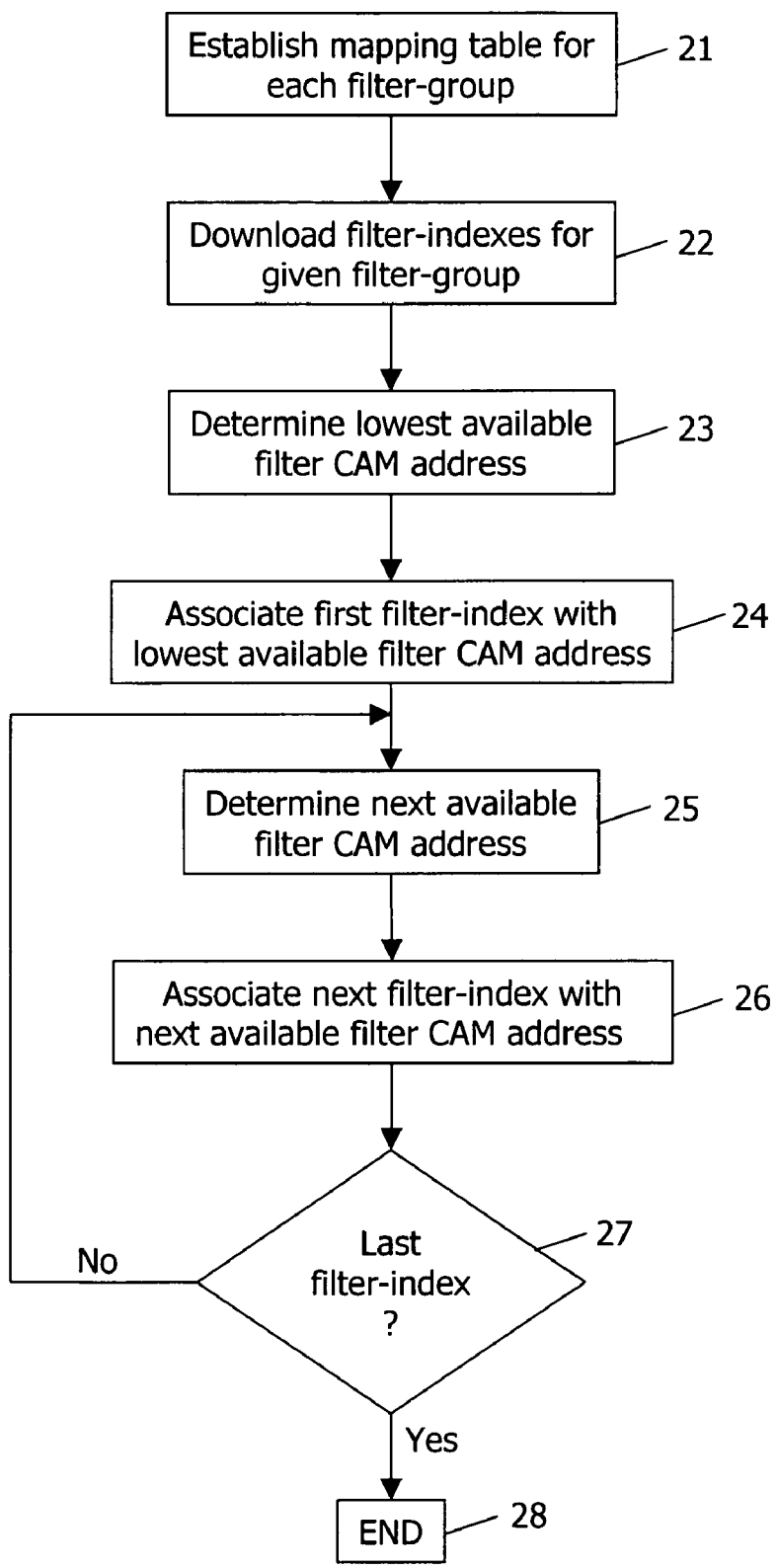
FIG. 2 is a flow diagram illustrating the steps of the method of the present invention.

FIG. 2 is a flow diagram illustrating the steps of the method of the present invention. At step 21, a mapping table is established for each filter-group. Each mapping table maps an original user-provided filter-index to a CAM address for every filter. At step 22, the CAM downloads filter-indexes for a given filter-group. At step 23, the CAM determines the lowest available filter CAM address, and at step 24 associates the first filter-index with the lowest available filter CAM address. At step 25, the CAM determines the next higher available filter CAM address, and at step 26 associates the next filter-index with the next higher available filter CAM address. At step 27, the CAM determines whether the last filter-index in the downloaded group has been associated with an address. If not, the process returns to step 25 and continues to determine available addresses and to associate filter-indexes with the available addresses until it is determined that the last filter-index in the downloaded group has been associated with an address. The process then ends at 28.

The present invention minimizes unused CAM space, and also allows easy sharing of CAM entries among different filter-groups making even more productive use of the CAM by providing statistical multiplexing among different applications. Thus, the CAM is used in a completely shared manner.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed:

1. A Content Addressable Memory (CAM), comprising:
    means for downloading a group of filters, each of said filters having an associated filter-index;
    a plurality of CAM addresses for storing the group of downloaded filters; and
    a mapping table for mapping each filter-index to an associated CAM address available for storing the downloaded filter associated with the filter-index, wherein each succeeding filter in the group of filters is stored in a higher address in the CAM.

2. The CAM of claim 1, wherein the plurality of CAM addresses are not all contiguous, and the mapping table maps each succeeding filter-index to the next higher available CAM address without regard to contiguity of the addresses.

3. The CAM of claim 2, wherein a portion of the CAM addresses that are not available are reserved for possible downloading of an additional group of filters.

4. The CAM of claim 3, wherein the groups of filters are of different sizes, and the number of reserved CAM addresses is equal to the number of filters in a largest group.

5. The CAM of claim 1, further comprising a second mapping table for mapping each CAM address back to the associated filter-index.

6. The CAM of claim 1, wherein a plurality of filter-groups are downloaded to the CAM, and the CAM comprises a plurality of mapping tables, one mapping table for each filter-group, wherein each mapping table maps each filter-index in the table's filter-group to an associated CAM address available for storing the downloaded filter associated with the filter-index.

7. In a Content Addressable Memory (CAM), a method of downloading and banking in the CAM, a filter-group having a plurality of filters, said method comprising:
    establishing a mapping table for the filter-group;
    downloading a plurality of filter-indexes associated with the filters in the filter-group; and
    mapping each filter-index to an associated CAM address available for storing the downloaded filter associated with the filter-index, wherein each succeeding filter in the group of filters is stored in a higher address in the CAM.

8. The method of claim 7, wherein the plurality of CAM addresses are not all contiguous, and the step of mapping includes mapping each succeeding filter-index to the next higher available CAM address without regard to contiguity of the addresses.

9. The method of claim 8, further comprising reserving a portion of the CAM addresses for possible downloading of an additional group of filters.

10. The method of claim 9, wherein the groups of filters are of different sizes, and the step of reserving a portion of the CAM addresses includes reserving a number of CAM addresses equal to the number of filters in a largest group.

11. The method of claim 7, further comprising establishing a second mapping table for mapping each CAM address back to the associated filter-index.

12. The method of claim 7, further comprising:
    downloading a plurality of filter-groups to the CAM;
    establishing a mapping table for each of the plurality of filter-groups; and
    mapping by each mapping table, each filter-index in the table's filter-group to an associated CAM address available for storing the downloaded filter associated with the filter-index.

13. In a Content Addressable Memory (CAM), a method of downloading and banking in the CAM, a filter-group having a plurality of filters, said method comprising:
    a) downloading a plurality of filter-indexes associated with the filters in the filter-group;
    b) establishing a mapping table for mapping each filter-index to an associated CAM address available for storing the downloaded filter associated with the filter-index;
    c) determining the lowest available filter CAM address;
    d) associating the first filter-index with the lowest available filter CAM address;
    e) determining the next higher available filter CAM address;
    f) associating the next filter-index with the next higher available filter CAM address;
    g) determining whether the last filter-index in the downloaded group has been associated with an address;
    h) upon determining that the last filter-index in the downloaded group has not been associated with an address, repeating steps e) through g); and
    i) upon determining that the last filter-index in the downloaded group has been associated with an address, ending the method.

14. The method of claim 13, wherein step e) includes determining a CAM address that is not contiguous to a previously associated CAM address.

* * * * *